(12) United States Patent
Law et al.

(10) Patent No.: US 7,439,788 B2
(45) Date of Patent: Oct. 21, 2008

(54) RECEIVE CLOCK DESKEWING METHOD, APPARATUS, AND SYSTEM

(75) Inventors: Hon-Mo Raymond Law, Beaverton, OR (US); Mamun Ur Rashid, Folsom, CA (US); Aaron K. Martin, El Dorado Hills, CA (US)

(73) Assignee: Intel Corporation

( * ) Notice: Subject to any disclaimer, the term of this patent is extended or adjusted under 35 U.S.C. 154(b) by 0 days.

(21) Appl. No.: 11/319,689

(22) Filed: Dec. 28, 2005

(65) Prior Publication Data

US 2007/0146035 A1    Jun. 28, 2007

(51) Int. Cl.
    *H03K 5/13*    (2006.01)
(52) U.S. Cl. .......................... 327/231; 327/232
(58) Field of Classification Search ................ 327/147, 327/150, 155, 156, 162, 163, 17, 25, 373–376; 331/17, 25; 375/373–376
    See application file for complete search history.

(56) References Cited

U.S. PATENT DOCUMENTS

| 6,122,336 | A | 9/2000 | Anderson | 375/371 |
| 6,137,325 | A | 10/2000 | Miller | 327/156 |
| 7,170,962 | B2* | 1/2007 | Joy et al. | 375/371 |
| 2004/0066873 | A1* | 4/2004 | Cho et al. | 375/376 |
| 2004/0071227 | A1 | 4/2004 | Lee | 375/308 |
| 2006/0083343 | A1 | 4/2006 | Roederer et al. | |

FOREIGN PATENT DOCUMENTS

| EP | 1363399 A2 | 11/2003 |
| WO | WO-0237677 A2 | 5/2002 |
| WO | WO-2007078700 A1 | 7/2007 |

OTHER PUBLICATIONS

Hatakaeyama, Atsushi, "A 256-Mb SDRAM Using a Register-Controlled Digital DLL", *IEEE Journal of Solid-State Circuit*, vol. 32, No. 11, (Nov. 1977), pp. 1728-1734.

* cited by examiner

*Primary Examiner*—Linh My Nguyen

(57) ABSTRACT

An integrated circuit includes clock deskew circuitry. The deskew circuitry includes multiple loop circuits to align a received clock with a data eye, and to reduce the effects of clock drift caused by voltage and temperature variations. The loop circuits include phase interpolators to produce local clock signals. Local clock signals are provided to seqiuential elements through local clock trees and are also provided to a phase detector through a dummy local clock tree. The operation of the phase interpolators is influenced by the phase detector.

22 Claims, 6 Drawing Sheets

RECEIVE CLOCK DESKEWING METHOD, APPARATUS, AND SYSTEM

FIELD

The present invention relates generally to clock circuits, and more specifically to clock circuits with deskew.

BACKGROUND

Integrated circuits such as processors and memory devices typically communicate with each other using digital data signals and clock signals. Some systems use "clock forwarding" schemes where a device that sources digital data signals also sources the associated clock signal. The clock signal is then used at the receiving device to clock the received data.

FIG. 1 shows a prior art system with clock forwarding. System 100 includes integrated circuits 110 and 150 interconnected by conductors 120 and 122. Integrated circuit 110 includes drivers 112 and 114 to drive a digital data signal on conductor 120 and a clock signal on conductor 122, respectively. Integrated circuit 150 includes receiver 152 to receive the digital data signal, and receiver 154 to receive the clock signal. Integrated circuit 150 also includes sequential element 156 to clock the data signal using the clock signal.

The various signal paths shown in integrated circuit 150 are subject to signal propagation delays, some of which may vary with temperature and power supply voltage variations. For example, propagation delay variations may occur in receivers 152 and 154 and the signal lines providing the clock and data to sequential element 156. The clock signal line is shown having coupling to ground, and the data signal line is shown having delay resulting from additional buffers. In general, propagation delay may be introduced in any clock or data path by a variety of means.

Variations in propagation delay can cause "skew" between the clock and data signals. For example, the phase of the clock signal may advance or delay relative the phase of the data signal. If the skew becomes too great, then the clock signal may not reliably clock the data signal into sequential element 156.

DESCRIPTION OF EMBODIMENTS

Figure 1:
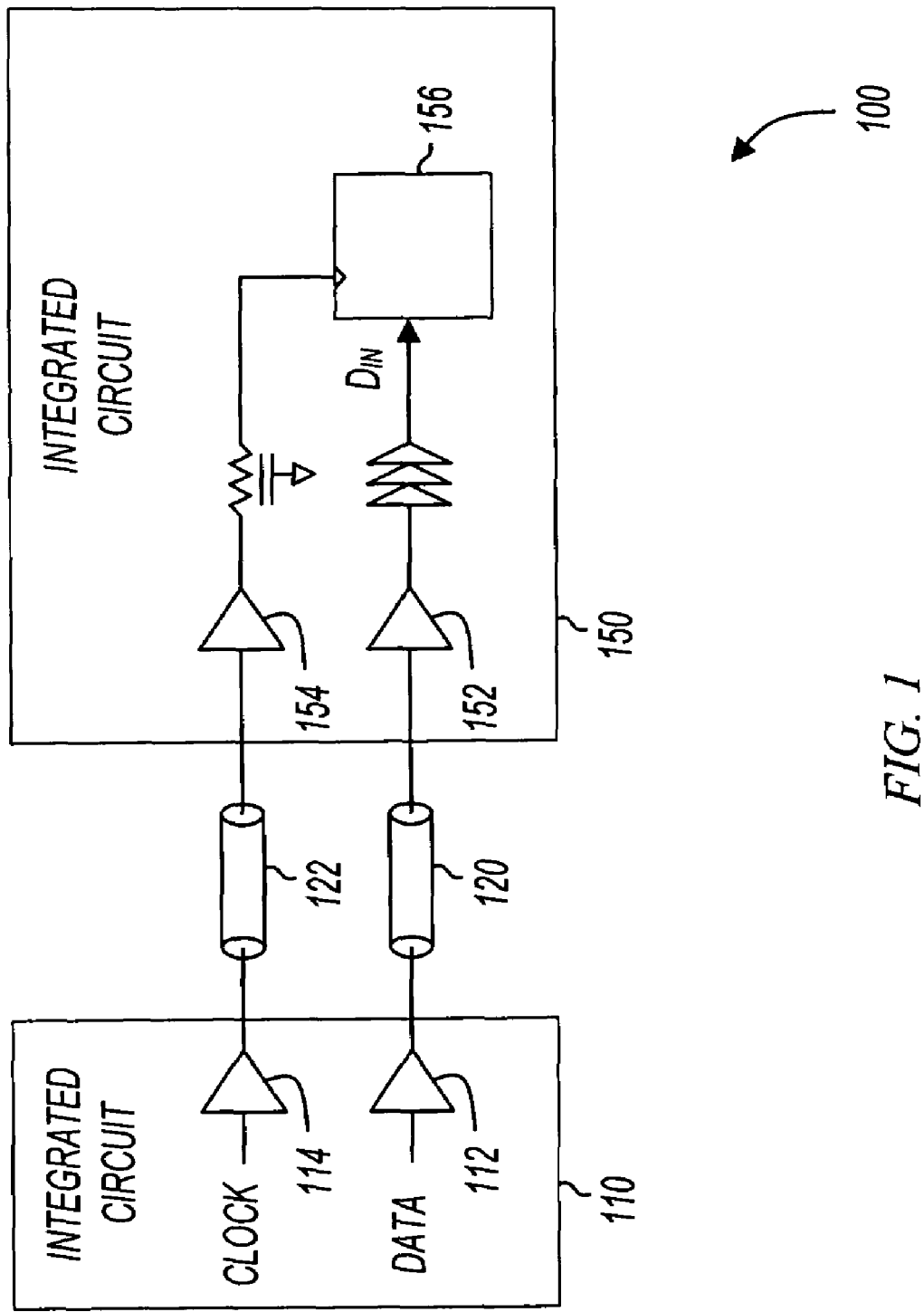
FIG. 1 shows a prior art system with clock forwarding.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
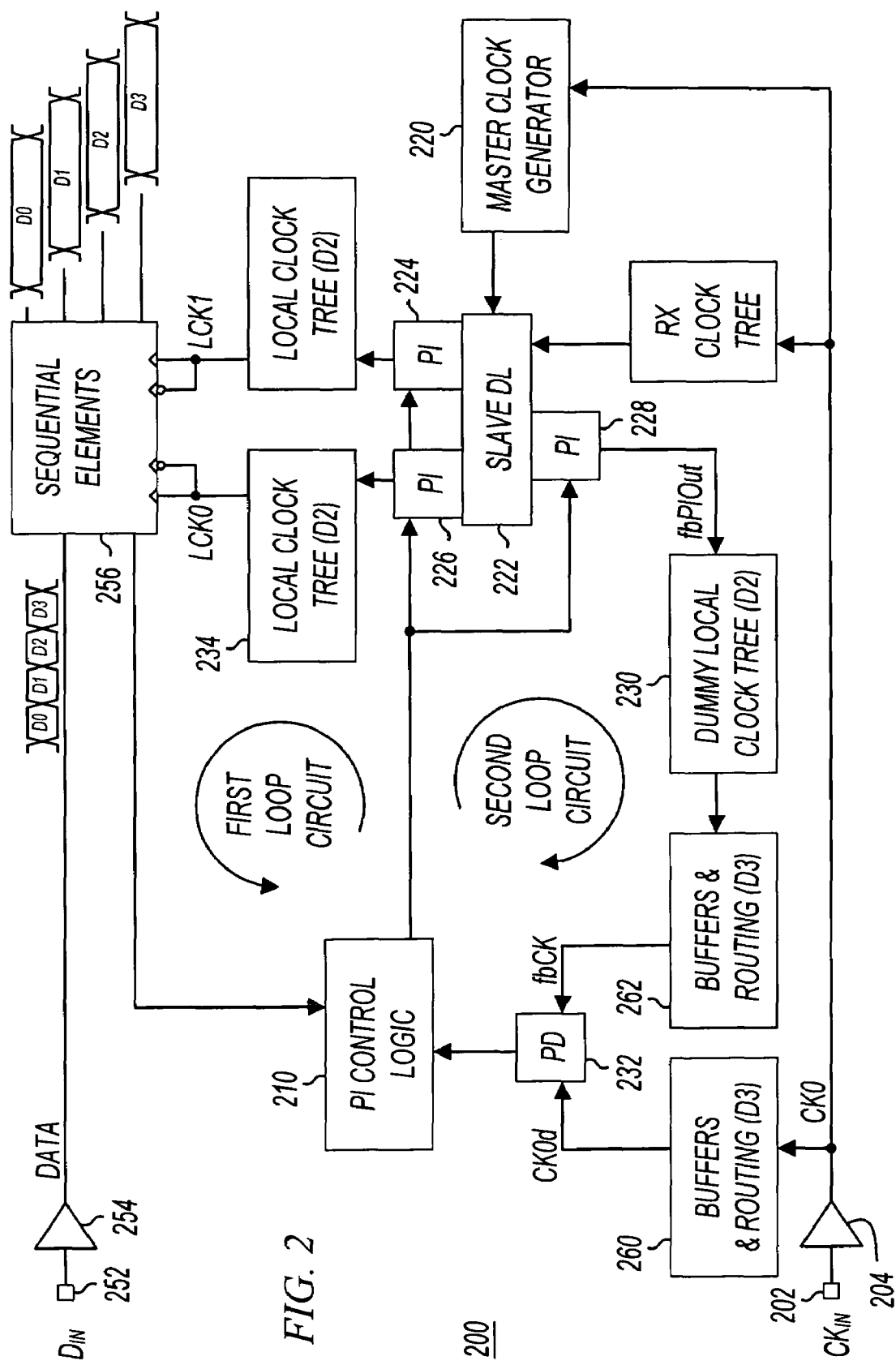
FIG. 2 shows an integrated circuit with clock deskew.

FIG. 2 shows an integrated circuit with clock deskew. Integrated circuit 200 receives an input clock signal on pad 202, receives an input data signal on pad 252, and clocks digital data into sequential elements 256. Sequential elements 256 may be any type of sequential elements capable of storing digital data. For example, sequential elements may include latches, flip-flops, or the like.

In some embodiments, the data signal includes more than one data symbol for each cycle of the input clock signal. For example, in some embodiments, the input data signal may include four data symbols for each cycle of the input clock signal. Integrated circuit 200 may be used in a high-speed system that uses a forwarded, multi-phase clocking scheme, where one transition on the input clock signal is received with every group of data. The remainder of this description refers to embodiments that include four data symbols for each transition on the input clock signal, but this is not a limitation of the present invention.

In operation, the input clock ($CK_{IN}$) is received by receiver 204, and provided to Master clock generator 220 and slave delay line (DL) 222. As shown in FIG. 2, master clock generator 220 provides control signal(s) to slave delay line 222. In some embodiments, integrated circuit 200 includes a single master clock generator and multiple slave delay lines distributed about the integrated circuit. In other embodiments, master clock generator 220 and slave delay line 222 are combined, and operate as a single clock generator. In some embodiment, master clock generator 220 is implemented as a delay-locked loop (DLL). In other embodiments, master clock generator 220 is implemented as a phase-locked loop.

Delay line 222 produces multiple clocks of different phases. For example, delay line 222 may produce two or more clock signals having a substantially fixed phase difference, such as 45 degrees between clock phases or 90 degrees between clock phases. Phase interpolators (PI) 224, 226, and 228 receive multiple clock signals from delay line 222, and interpolate in phase between them to produce local clock signals. The phase interpolators provide interpolation in response to control information received from PI control logic 210.

Integrated circuit 200 includes multiple loop circuits to generate and deskew local clock signals that are used to reliably clock the input data. A first loop circuit includes phase interpolators 224, 226, sequential elements 256, and PI control logic 210. A second loop circuit includes phase interpolator 228, dummy local clock tree 230, buffers and routing 262, phase detector (PD) 232, and PI control logic 210.

The first loop circuit is used to trim the received clock phase into the center of the received data eye at power up. For example, a known link training data pattern may be received at input data pad 252, and PI control logic 210 may sweep the clock phase of the local clock signals by modifying the interpolator settings for phase interpolators 224 and 226. Based on feedback from sequential elements 256, PI control logic 210 may select appropriate settings for phase interpolators 224 and 226 to fix the phase relationships between the local clock signals used to clock the input data. This procedure is referred to as the "link training."

Once the link training is complete, the phase differences between the local clock signals are fixed by virtue of the PI control codes provided to the phase interpolators by PI control logic 210. The second control loop operates to maintain the phase relationship between the input clock signal and the local clock signals during normal operation. As a result, in addition to the relative phases between local clock signals remaining constant, the absolute phase values of the local clock signals remain substantially constant with respect to the input clock signal. To the extent that the input clock signal and the input data are phase matched at pads 202 and 252, the local clock signals are also phase matched to the input data to allow reliable clocking of the input data into sequential elements 256. The second loop circuit trims out clock phase variations caused by voltage and temperature variations, and periodic re-training of the link is not required except for exceptional circumstances such as when the loop is shut down and loses lock.

The second loop circuit utilizes a combination of delay matching techniques and loop locking techniques to lock the phase of the local clock signals to the phase of the input clock signal. For example, phase interpolator 226 produces a clock that is driven through local clock tree 234. Local clock tree 234 may include any number of buffers, inverters, signal traces, and the like. Likewise, phase interpolator 228 produces a local clock signal to be fed back through dummy local clock tree 230. Dummy local clock tree 230 includes structures equivalent to those found in local clock tree 234, so that dummy local clock tree 230 and local clock tree 234 have substantially equivalent delay characteristics (D2). In addition, buffers and routing 260 provides a path for the clock from receiver 204 to PD 232, and buffers and routing 262 are in the second loop circuit between phase interpolator 228 and PD 232. Buffers and routing 262 are provided to substantially match the delay characteristics (D3) of buffers and routing 260.

Phase interpolators 224, 226, and 228 are controlled in parallel by the phase interpolator control logic. The phase interpolator control logic operates in response to feedback from sequential elements 256 during link training, and also operates in response to phase error information from phase detector 232 during operation. In response to the phase error information received from phase detector 232, PI control logic 210 influences the operation of the various phase interpolators in parallel.

The following sequence is an operational example that deskews the input clock signal and trims out phase variations caused by voltage and temperature variations.

1. Lock fbCK to CK0d
2. Link initialization: Run the link training sequence on data to find the optimal position of receive clock for data sampling.
3. Fix the relationship between all 3 PI's.
4. Training is done, let the second loop circuit compensate from this point on.

Integrated circuit 200 may be any type of integrated circuit. For example, integrated circuit 200 may be a memory device, a controller, a processor, or any other integrated circuit that receives a clock signal and a data signal. Various functional blocks that are part of the integrated circuit are intentionally omitted from FIG. 2 to provide clarity in this description. Although only one input clock signal and one input data signal are shown in FIG. 2, this is not a limitation of the present invention. For example, many data signals may be deskewed relative to a single clock signal. Further, integrated circuit 200 may include multiple "port" circuits, where each port circuit receives one clock signal and multiple data signals. Master clock generator 220, PI control logic 210, and other functional blocks may be shared across multiple data signal paths, or multiple ports, or both.

Figure 3:
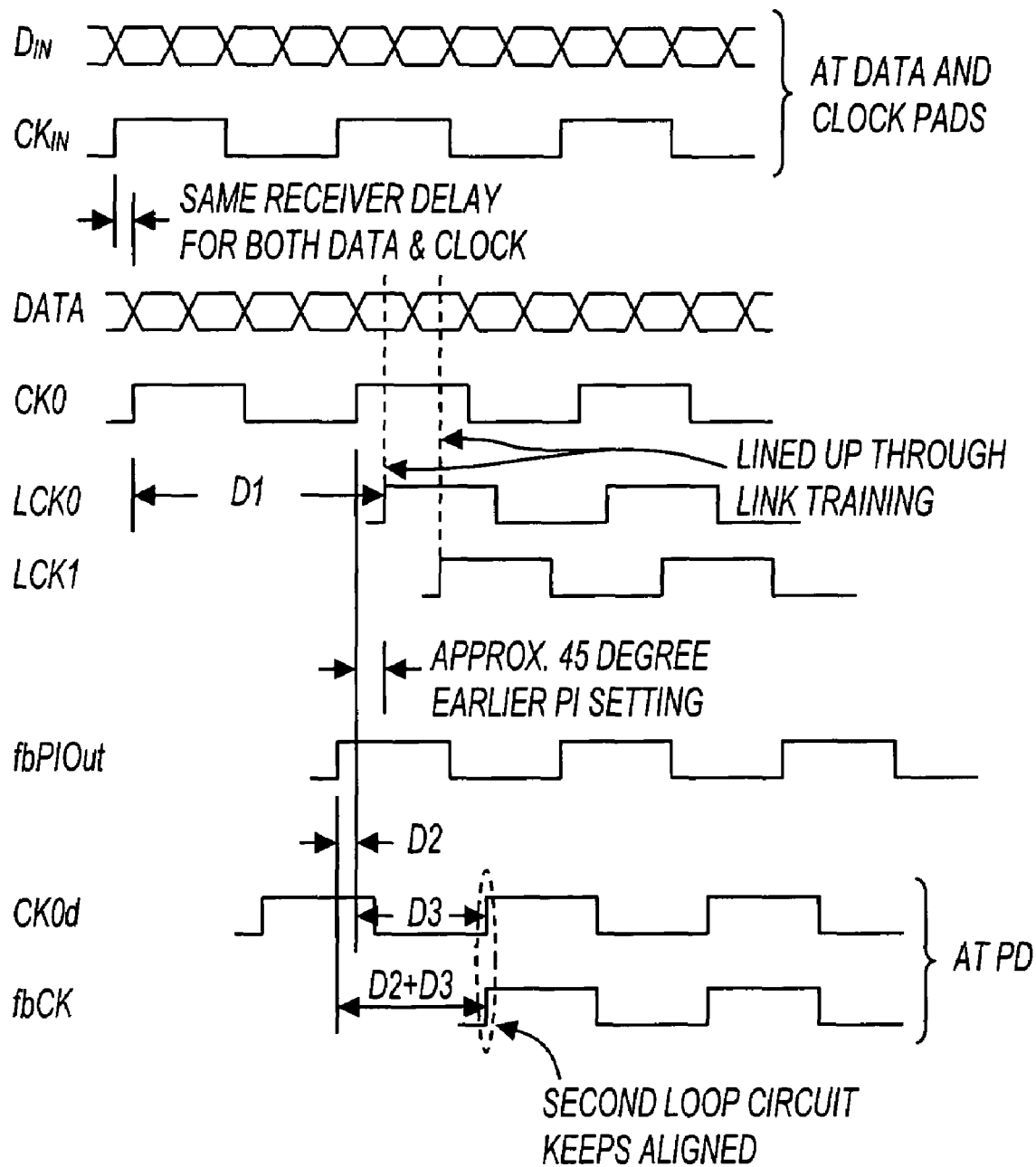
FIG. 3 shows a timing diagram.

FIG. 3 shows a timing diagram. The timing diagram of FIG. 3 shows the operation of the second loop circuit. The input data signal ($D_{IN}$) and the forwarded source synchronous input clock signal ($CK_{IN}$) arrive in phase at the data and clock pads 202, 252 (FIG. 2). Due to the matched data and clock receivers 204, 254, data at the sequential elements' inputs is still in phase with signal CK0, output of the clock receiver 204, which is the point-of-divergence of the clock signal. From CK0, one path travels down the Rx clock tree, through the slave delay line 222, PI 226, and local clock tree 234, and becomes the local clock signal LCK0 that drives at least one of sequential elements 256. The delay from CK0 to LCK0 is denoted as D1. Note that the rising edge of LCK0 is at the middle of the data eye through the link training. Phase interpolator 228 outputs the signal fbPIOut that in some embodiments is approximately 45-degrees earlier than LCK0 plus the delay of local clock tree 234 (D2). This signal goes through buffers and routing 262 (delay D3) and dummy local clock tree 230 (D2) to arrive at the phase detector (PD) as fbCK. In the mean time, the other clock path begins with CK0, through the matching delay path of buffers and routing 260 (D3), and ends at the PD as CK0d. The PD detects the phase difference between CK0d and fbCK and adjusts the PI control codes to lock the two signals and thus eliminates the clock drift.

Figure 4:
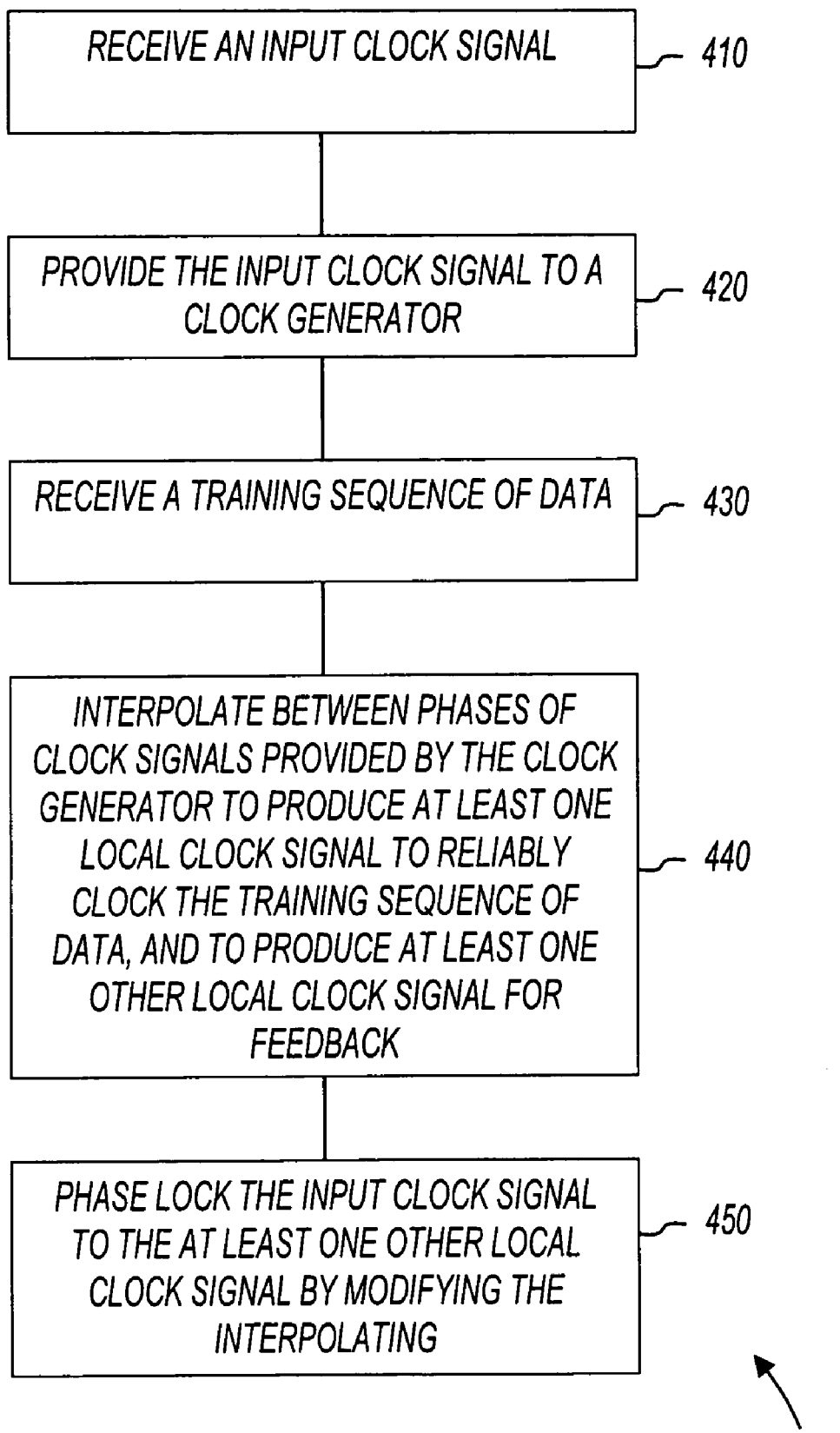
FIG. 4 shows a flowchart in accordance with various embodiments of the present invention.

FIG. 4 shows a flowchart in accordance with various embodiments of the present invention. In some embodiments, method 400 may be used to perform clock deskew. In some embodiments, method 400, or portions thereof, is performed by an input/output (I/O) circuit in an integrated circuit, embodiments of which are shown in the various figures. In other embodiments, method 400 is performed by a controller or memory device. Method 400 is not limited by the particular type of apparatus performing the method. The various actions in method 400 may be performed in the order presented, or may be performed in a different order. Further, in some embodiments, some actions listed in FIG. 4 are omitted from method 400.

Method 400 begins at 410 in which an input clock signal is received. At 420, the input clock signal is provided to a clock generator. In some embodiments, the actions of 420 correspond to providing the input clock to a delay-locked loop, and in other embodiments, the actions of 420 correspond to providing the input clock to a phase-locked loop. The actions of 410 and 420 correspond to integrated circuit 200 (FIG. 2) receiving $CK_{IN}$ and providing the clock to master clock generator 220.

At 430, a training sequence of data is received. This may occur when link training is performed. For example, when a system is powered up, link training may be performed to deskew clock signals with respect to data signals. Further, link training may be performed if any of the various loop circuits lose lock.

At 440, phase interpolation is performed. The clock generator provides multiple clock signals, and phase interpolation between the multiple clock signals is performed to produce at least one local clock signal to reliably clock the training sequence of data and to produce at least one other local clock signal for feedback. In some embodiments, the clock generator includes a master clock generator and one or more slave delay lines. In these embodiments, the multiple clock signals may be provided by either the master clock generator or the slave delay line(s). Referring now back to FIG. 2, the actions of 440 correspond to phase interpolators 226 and 224 producing clock signals having appropriate phases for clocking the data into sequential elements 256. The actions of 440 further correspond to phase interpolator 228 producing fbPIOut for feedback.

At 450, the input clock signal is phase locked to the at least one other local clock signal by modifying the interpolating performed at 440. For example, PD 232 phase locks fbCK to CK0d. The second loop circuit keeps these two signals locked by altering phase interpolator control codes in response to any phase error found. In some embodiments, the actions of 450 are performed prior to, or simultaneously with, the other actions of method 400. That is, the first and second loop circuits of FIG. 2 may be allowed to lock in any order or simultaneously.

Figure 5:
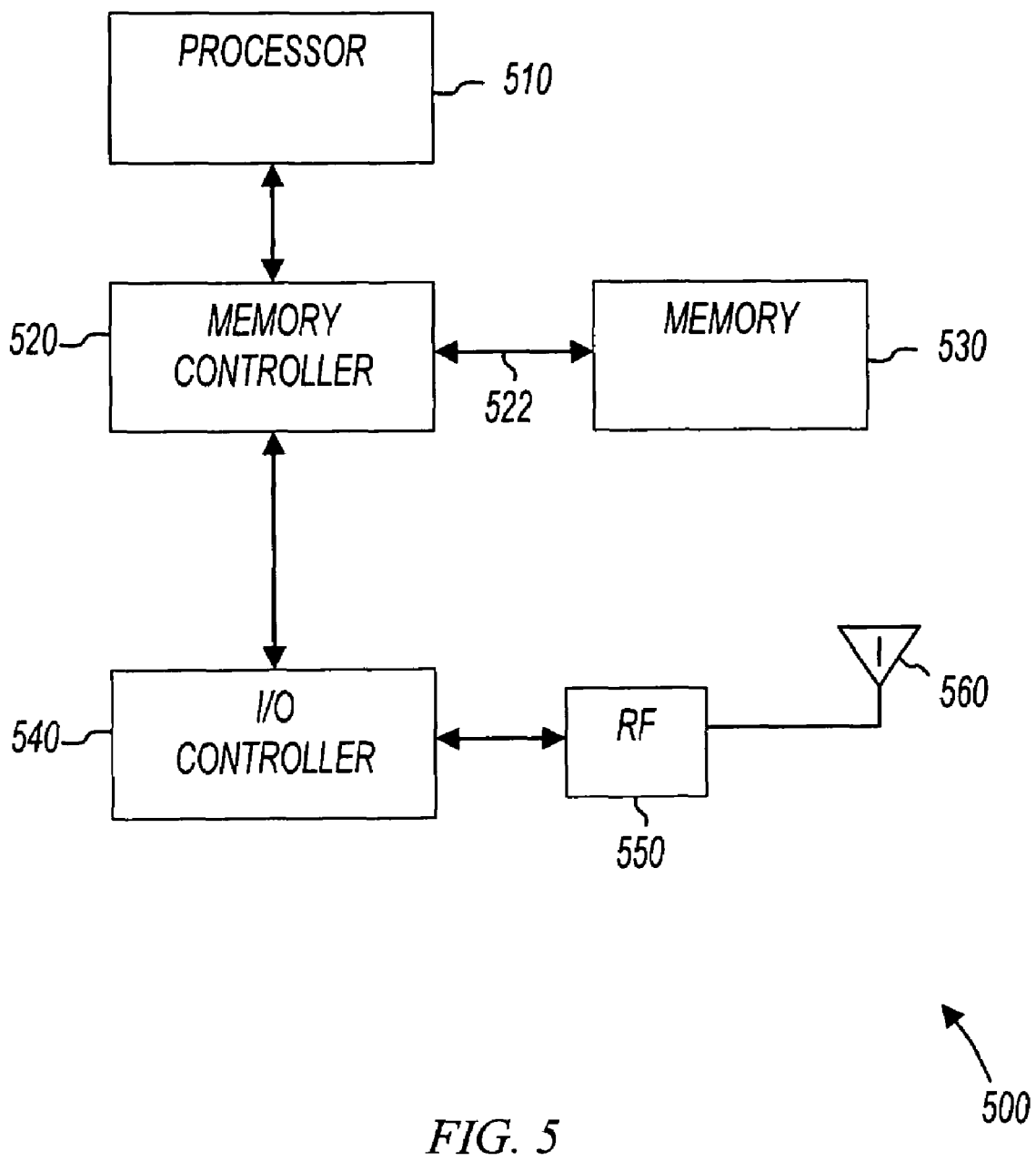
FIGS. 5 and 6 show diagrams of electronic systems in accordance with various embodiments of the present invention.

FIG. 5 shows an electronic system in accordance with various embodiments of the present invention. Electronic system 500 includes processor 510, memory controller 520, memory 530, input/output (I/O) controller 540, radio frequency (RF) circuits 550, and antenna 560. In operation, system 500 sends and receives signals using antenna 560, and these signals are processed by the various elements shown in FIG. 5. Antenna 560 may be a directional antenna or an omni-directional antenna. As used herein, the term omni-directional antenna refers to any antenna having a substantially uniform pattern in at least one plane. For example, in some embodiments, antenna 560 may be an omni-directional antenna such as a dipole antenna, or a quarter wave antenna. Also for example, in some embodiments, antenna 560 may be a directional antenna such as a parabolic dish antenna, a patch antenna, or a Yagi antenna. In some embodiments, antenna 560 may include multiple physical antennas.

Radio frequency circuit 550 communicates with antenna 560 and I/O controller 540. In some embodiments, RF circuit 550 includes a physical interface (PHY) corresponding to a communications protocol. For example, RF circuit 550 may include modulators, demodulators, mixers, frequency synthesizers, low noise amplifiers, power amplifiers, and the like. In some embodiments, RF circuit 550 may include a heterodyne receiver, and in other embodiments, RF circuit 550 may include a direct conversion receiver. In some embodiments, RF circuit 550 may include multiple receivers. For example, in embodiments with multiple antennas 560, each antenna may be coupled to a corresponding receiver. In operation, RF circuit 550 receives communications signals from antenna 560, and provides analog or digital signals to I/O controller 540. Further, I/O controller 540 may provide signals to RF circuit 550, which operates on the signals and then transmits them to antenna 560.

Processor 510 may be any type of processing device. For example, processor 510 may be a microprocessor, a microcontroller, or the like. Further, processor 510 may include any number of processing cores, or may include any number of separate processors.

Memory controller 520 provides a communications path between processor 510 and other devices shown in FIG. 5. In some embodiments, memory controller 520 is part of a hub device that provides other functions as well. As shown in FIG. 5, memory controller 520 is coupled to processor 510, I/O controller 540, and memory 530.

Memory 530 may include any of the clock deskew embodiments described herein. For example, memory device 530 may include the circuitry described with reference to FIG. 2. Further, memory 530 may include multiple memory devices where each of the memory devices includes the circuitry described with reference to FIG. 2. Memory 530 may be any type of memory technology. For example, memory 530 may be random access memory (RAM), dynamic random access memory (DRAM), static random access memory (SRAM), nonvolatile memory such as FLASH memory, or any other type of memory.

Memory 530 may represent a single memory device or a number of memory devices on one or more memory modules. Memory controller 520 provides data through bus 522 to memory 530 and receives data from memory 530 in response to read requests. Commands and/or addresses may be provided to memory 530 through conductors other than bus 522 or through bus 522. Memory controller 530 may receive data to be stored in memory 530 from processor 510 or from another source. Memory controller 520 may provide the data it receives from memory 530 to processor 510 or to another destination. Bus 522 may be a bi-directional bus or unidirectional bus. Bus 522 may include many parallel conductors. The signals may be differential or single ended. In some embodiments, bus 522 operates using a forwarded, multiphase clock scheme.

Memory controller 520 is also coupled to I/O controller 540, and provides a communications path between processor 510 and I/O controller 540. I/0 controller 540 includes circuitry for communicating with I/O circuits such as serial ports, parallel ports, universal serial bus (USB) ports, and the like. As shown in FIG. 5, I/O controller 540 provides a communications path to RF circuits 550.

Figure 6:
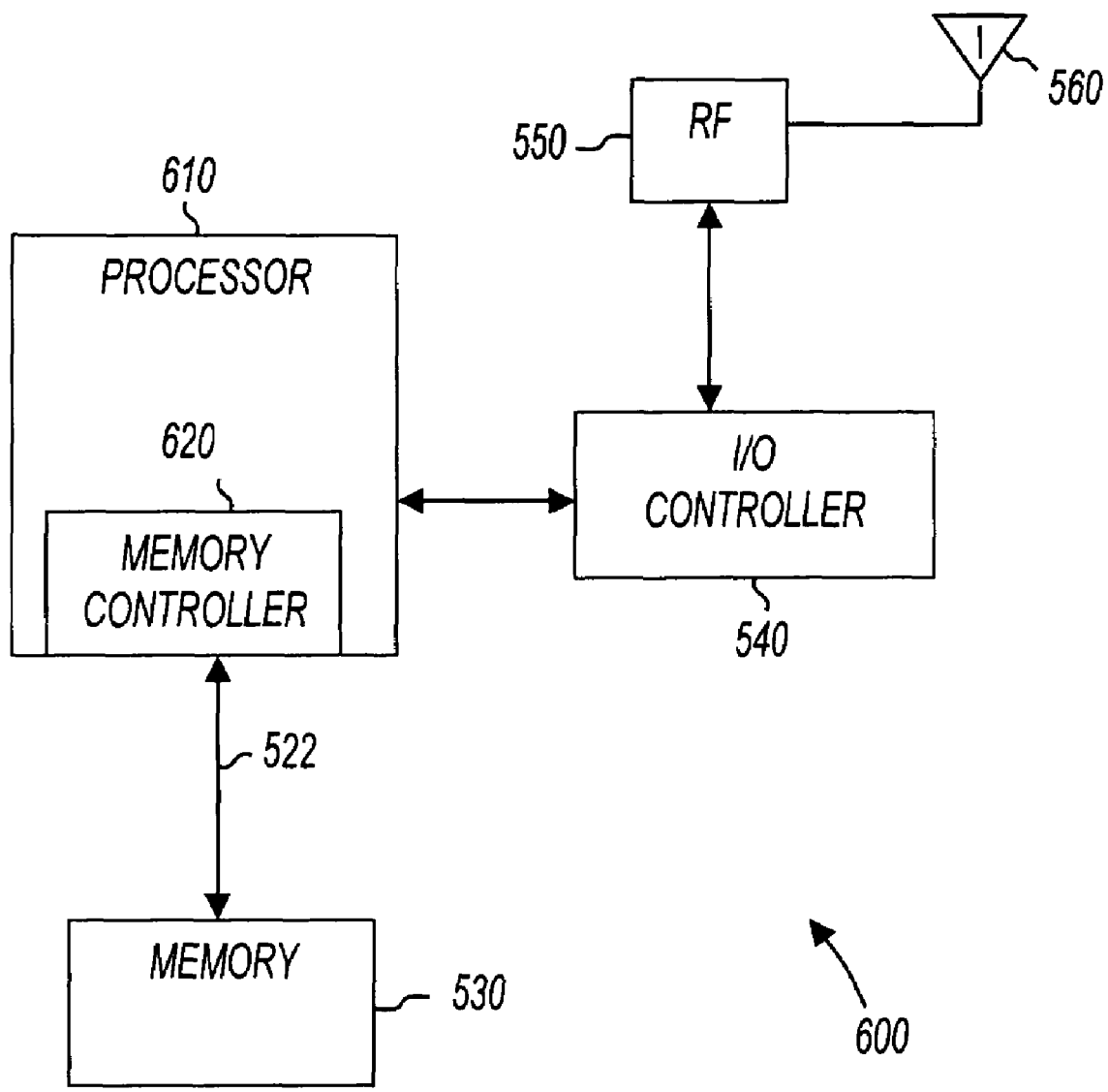

FIG. 6 shows an electronic system in accordance with various embodiments of the present invention. Electronic system 600 includes memory 530, I/O controller 540, RF circuits 550, and antenna 560, all of which are described above with reference to FIG. 5. Electronic system 600 also includes processor 610 and memory controller 620. As shown in FIG. 6, memory controller 620 is included in processor 610. Processor 610 may be any type of processor as described above with reference to processor 510 (FIG. 5). Processor 610 differs from processor 510 in that processor 610 includes memory controller 620, whereas processor 510 does not include a memory controller.

Example systems represented by FIGS. 5 and 6 include desktop computers, laptop computers, cellular phones, personal digital assistants, wireless local area network interfaces, or any other suitable system. Many other systems uses for clock deskew exist. For example, the clock deskew embodiments described herein may be used in a server computer, a network bridge or router, or any other system with or without an antenna.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. An integrated circuit comprising:
   a clock input pad to receive an input clock signal;
   a data input pad to receive a data signal;
   a clock generator coupled to receive the input clock signal;
   a plurality of phase interpolators responsive to the clock generator to produce a plurality of local clock signals, wherein at least one of the plurality of local clock signals has a phase suitable to clock the data signal;
   a phase detector coupled to compare the input clock signal and one of the plurality of local clock signals; and
   phase interpolator control logic to influence operation of the plurality of phase interpolators responsive to a signal from the phase detector.

2. The integrated circuit of claim 1 wherein the plurality of phase interpolators includes:
a first phase interpolator to produce a first local clock signal;
a second phase interpolator to produce a second local clock signal to provide to the phase detector.

3. The integrated circuit of claim 2 wherein the plurality of phase interpolators further includes a third phase interpolator to produce a third local clock signal at substantially 90 degrees relative to the first local clock signal.

4. The integrated circuit of claim 3 wherein the first, second, and third phase interpolators are controlled in parallel by the phase interpolator control logic.

5. The integrated circuit of claim 2 further comprising:
a sequential element coupled to receive the data signal;
a first local clock tree coupled to provide the first local clock signal to the sequential element; and
a dummy local clock tree coupled to provide the second local clock signal to the phase detector, wherein the dummy local clock tree and the first local clock tree have substantially equivalent delay characteristics.

6. The integrated circuit of claim 1 wherein the plurality of phase interpolators produce a plurality of local clock signals to clock the data signal four times for each cycle of the input clock signal.

7. The integrated circuit of claim 6 wherein the plurality of phase interpolators produce two local clock signals substantially 90 degrees apart to clock the data signal four times for each cycle of the input clock signal.

8. The integrated circuit of claim 1 wherein the clock generator comprises a master delay-locked loop and a slave delay line.

9. The integrated circuit of claim 1 wherein the clock generator comprises a phase-locked loop.

10. An integrated circuit having a loop circuit for clock deskew, wherein the loop circuit includes a clock generator to receive an input clock signal, a phase interpolator to interpolate between phases of signals received from the clock generator, and a phase detector to compare phases of the input clock signal and a first local clock signal received from the phase interpolator, wherein the phase interpolator interpolates responsive to phase error information from the phase detector;
the integrated circuit further comprising a second phase interpolator responsive to the phase error information, the second phase interpolator provides a second local clock signal to clock a sequential element, the integrated circuit further comprising a first local clock tree to provide the second local clock signal to the sequential element, and a dummy local clock tree to provide the first local clock signal to the phase detector, wherein the dummy local clock tree and the first local clock tree have substantially equivalent delay characteristics.

11. An integrated circuit having a loop circuit for clock deskew, wherein the loop circuit includes a clock generator to receive an input clock signal, a phase interpolator to interpolate between phases of signals received from the clock generator, and a phase detector to compare phases of the input clock signal and a first local clock signal received from the phase interpolator, wherein the phase interpolator interpolates responsive to phase error information from the phase detector;
the integrated circuit further comprising second and third phase interpolators responsive to the phase error information, the second and third phase interpolators provide local clock signals to clock four data symbols for each cycle of the input clock signal.

12. The integrated circuit of claim 11 further comprising phase interpolator control logic to receive the phase error information and to influence operation of the phase interpolator and the second and third phase interpolators.

13. A method comprising:
receiving an input clock signal;
providing the input clock signal to a clock generator;
receiving a training sequence of data;
interpolating between phases of clock signals provided by the clock generator to produce at least one local clock signal to reliably clock the training sequence of data, and to produce at least one other local clock signal for feedback; and
phase locking the input clock signal to the at least one other local clock signal by modifying the interpolating.

14. The method of claim 13 wherein interpolating to produce at least one clock signal comprises interpolating to produce a first local clock signal having a phase; and interpolating to produce a second local clock signal having a substantially fixed phase relationship with respect to the phase of the first local clock signal.

15. The method of claim 13 further comprising clocking four data symbols in the training sequence for each cycle of the input clock signal.

16. The method of claim 13 further comprising delay matching a first local clock tree and a dummy local clock tree, wherein the first local clock tree includes at least one buffer to transmit the at least one local clock signal to reliably clock the training sequence of data, and wherein the dummy local clock tree includes at least one buffer to transmit the at least one other local clock signal for feedback.

17. An electronic system comprising:
an antenna;
a radio frequency circuit coupled to the antenna;
a controller coupled to the radio frequency circuit; and
a memory device coupled to the controller, the memory device including a clock input pad to receive an input clock signal, a data input pad to receive a data signal, a clock generator to receive the input clock signal, a plurality of phase interpolators responsive to the clock generator to produce a plurality of local clock signals, wherein at least one of the plurality of local clock signals has a phase suitable to clock the data signal, a phase detector to compare the input clock signal and one of the plurality of local clock signals, and phase interpolator control logic to influence operation of the plurality of phase interpolators responsive to a signal from the phase detector.

18. The electronic system of claim 17 wherein the plurality of phase interpolators includes:
a first phase interpolator to produce a first local clock signal;
a second phase interpolator to produce a second local clock signal at substantially 90 degrees relative to the first local clock signal; and
a third phase interpolator to produce a third local clock signal to provide to the phase detector.

19. The electronic system of claim 18 wherein the first, second, and third phase interpolators are controlled in parallel by the phase interpolator control logic.

20. The electronic system of claim 18 wherein the memory device further comprises:
a sequential element coupled to receive the data signal;
a first local clock tree to provide the first local clock signal to the sequential element; and a dummy local clock tree to provide the third local clock signal to the phase detector, wherein the dummy local clock tree and the first local clock tree have substantially equivalent delay characteristics.

21. The integrated circuit of claim 11 wherein the second and third phase interpolators produce two local clock signals substantially 90 degrees apart to clock the four data symbols for each cycle of the input clock signal.

22. The integrated circuit of claim 21 further comprising at least one local clock tree to provide the two local clock signals to sequential elements that clock the four data symbols, and a dummy local clock tree to provide the first local clock signal to the phase detector, wherein the dummy local clock tree and the at least one local clock tree have substantially equivalent delay characteristics.

* * * * *